(12) United States Patent
Tsurumaki

(10) Patent No.: US 9,164,125 B2
(45) Date of Patent: Oct. 20, 2015

(54) VEHICLE DOOR HANDLE APPARATUS

(75) Inventor: Koichi Tsurumaki, Kanagawa (JP)

(73) Assignee: ALPHA CORPORATION, Yokohama-shi, Kanagawa (JP)

( * ) Notice: Subject to any disclaimer, the term of this patent is extended or adjusted under 35 U.S.C. 154(b) by 131 days.

(21) Appl. No.: 13/808,333

(22) PCT Filed: Aug. 18, 2011

(86) PCT No.: PCT/JP2011/068695
§ 371 (c)(1),
(2), (4) Date: Jan. 4, 2013

(87) PCT Pub. No.: WO2012/023585
PCT Pub. Date: Feb. 23, 2012

(65) Prior Publication Data
US 2013/0113504 A1 May 9, 2013

(30) Foreign Application Priority Data
Aug. 19, 2010 (JP) ................ 2010-183692

(51) Int. Cl.
G01R 27/26 (2006.01)
G01R 1/04 (2006.01)
E05B 85/16 (2014.01)

(52) U.S. Cl.
CPC . G01R 1/04 (2013.01); E05B 81/77 (2013.01); E05B 85/16 (2013.01)

(58) Field of Classification Search
CPC ............ G01R 1/04; E05B 81/77; E05B 85/16
USPC ....................................................... 324/658
See application file for complete search history.

(56) References Cited

U.S. PATENT DOCUMENTS

| | | | | |
|---|---|---|---|---|
| 4,755,823 | A | * | 7/1988 | Ohe et al. ................ 343/713 |
| 7,029,054 | B2 | * | 4/2006 | Kobayashi et al. ........ 296/146.1 |
| 7,598,753 | B2 | * | 10/2009 | Ieda et al. ................ 324/658 |
| 7,763,819 | B2 | * | 7/2010 | Ieda et al. ................ 200/600 |
| 2003/0128116 | A1 | * | 7/2003 | Ieda et al. ................ 340/562 |
| 2006/0071755 | A1 | * | 4/2006 | Muller et al. ............ 340/5.72 |
| 2006/0180447 | A1 | * | 8/2006 | Korultay et al. ......... 200/329 |
| 2006/0238385 | A1 | * | 10/2006 | Steenwyk et al. ........ 341/33 |
| 2006/0255600 | A1 | * | 11/2006 | Belchine et al. ......... 292/336.3 |
| 2007/0075828 | A1 | | 4/2007 | Mizushima et al. |
| 2007/0091627 | A1 | | 4/2007 | Nitawaki et al. |
| 2007/0096905 | A1 | * | 5/2007 | Ieda et al. ................ 340/562 |
| 2007/0158960 | A1 | * | 7/2007 | Tanimoto et al. ........ 292/336.3 |
| 2009/0319212 | A1 | * | 12/2009 | Cech et al. ................ 702/65 |
| 2010/0237635 | A1 | * | 9/2010 | Ieda et al. ................ 292/336.3 |
| 2011/0012378 | A1 | * | 1/2011 | Ueno et al. ............... 292/336.3 |
| 2011/0025522 | A1 | * | 2/2011 | Peschl et al. ............. 340/686.6 |

FOREIGN PATENT DOCUMENTS

CN 1871404 A 11/2006
CN 1875384 A 12/2006
(Continued)

Primary Examiner — Benjamin M Baldridge
(74) Attorney, Agent, or Firm — Drinker Biddle & Reath LLP

(57) ABSTRACT

A vehicle door handle apparatus is provided with a handle main body formed by coupling a first cover and a second cover and a capacitance sensor accommodated in a hollow space in the handle main body. One of the first cover and the second cover is formed with an accommodation recess defined by partition walls. The capacitance sensor is accommodated in the accommodation recess and fixed by a potting agent.

8 Claims, 4 Drawing Sheets

(56) References Cited

FOREIGN PATENT DOCUMENTS

| | | |
|---|---|---|
| CN | 101240673 A | 8/2008 |
| JP | 2004-300843 | 10/2004 |
| JP | 2005-9216 | 1/2005 |
| JP | 2005-134178 | 5/2005 |
| JP | 2008-240492 | 10/2008 |
| JP | 2010-174562 | 8/2010 |

* cited by examiner

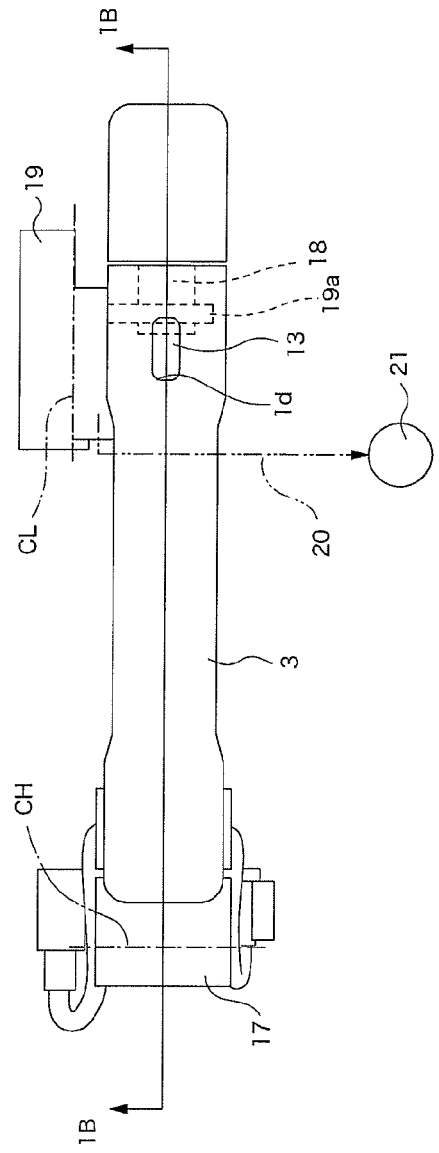
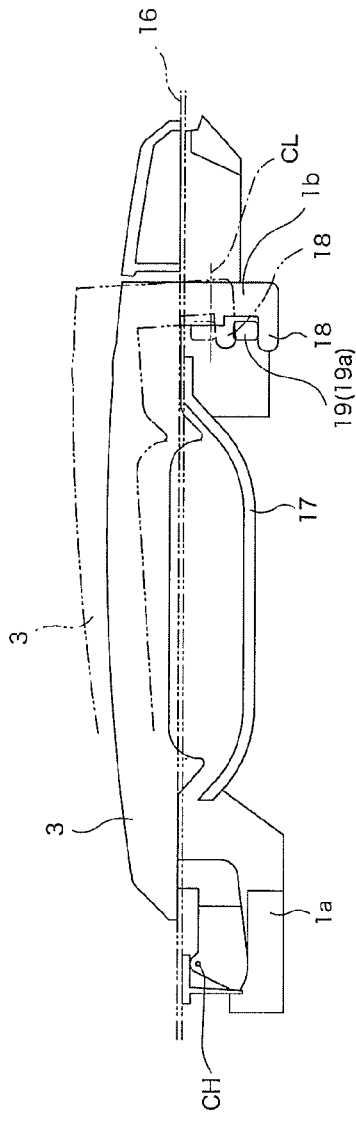
FIG.1(a)
FIG.1(b)

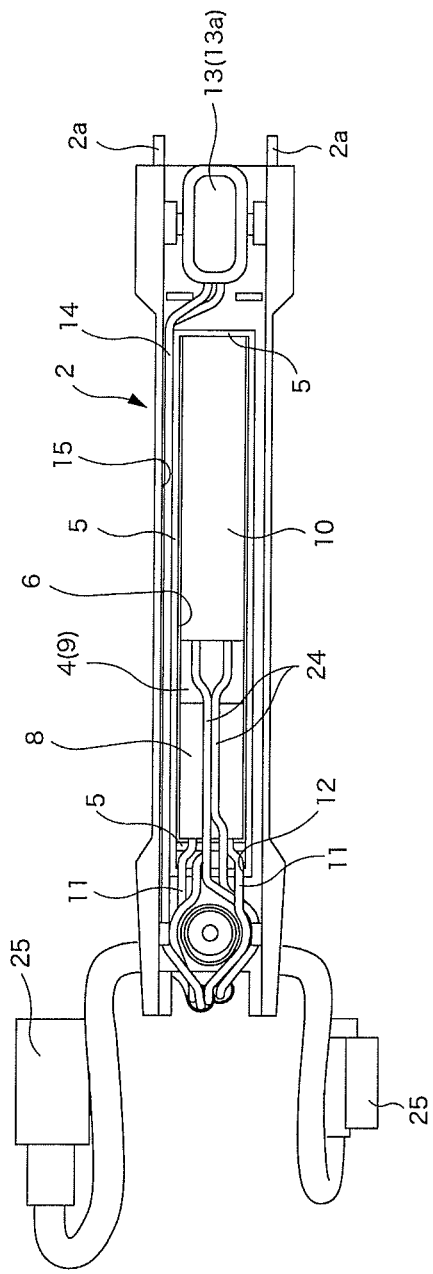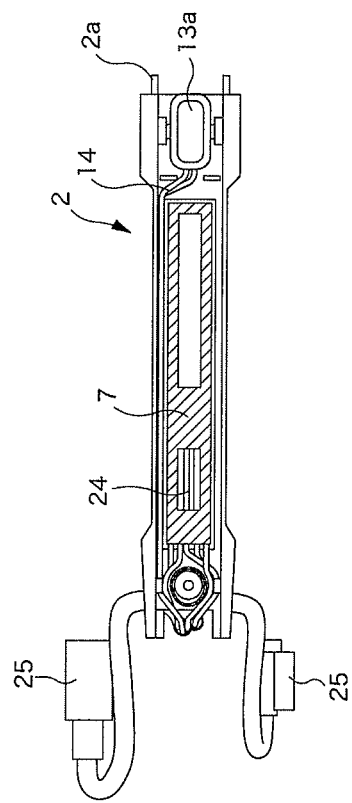

VEHICLE DOOR HANDLE APPARATUS

TECHNICAL FIELD

The present invention relates to a vehicle door handle apparatus.

BACKGROUND ART

Patent Document 1 discloses a vehicle door handle apparatus in which a capacitance sensor for detecting an approach and a contact to a handle main body is incorporated into the handle main body.

In the structure of Patent Document 1, the capacitance sensor is formed as a sensor unit in which an electrode and a detection circuit are covered with a covering material. Further, the capacitance sensor is accommodated and fixed to an accommodation recess of the handle main body.

The sensor unit is fixed to the accommodation recess by screwing an arm part formed at the sensor unit to the handle main body.

However, according to the structure of Patent Document 1, a fixation process using screws is required when the sensor unit is fixed to the handle main body and also there is a risk that water enters and resides in a gap formed between the accommodation recess and the sensor unit to cause a decrease in detection accuracy of the sensor unit.

PRIOR ART DOCUMENT

Patent Document

[Patent Document 1] JP-A-2005-009216

SUMMARY OF INVENTION

Embodiments of the present invention provide a vehicle door handle apparatus which is easy to assemble and also in which the detection accuracy of the capacitance sensor is high.

According to the embodiments, a vehicle door handle apparatus is provided with: a handle main body 3 formed by coupling a first cover 1 and a second cover 2; and a capacitance sensor 4 accommodated in a hollow space in the handle main body 3. The capacitance sensor 4 is configured as a unit by covering a detection circuit and an electrode with an outer shell member made of synthetic resin. One of the first cover 1 and the second cover 2 is formed with an accommodation recess 6 defined by partition walls 5. The capacitance sensor 4 is accommodated in the accommodation recess 6 and fixed by a potting agent 7 which prevents a water from entering a bottom wall 6B of the accommodation recess 6.

BRIEF DESCRIPTION OF DRAWINGS

FIG. 1(*a*) is a front view showing a door handle apparatus of an exemplary embodiment. FIG. 1(*b*) is a sectional view taken along line 1B of FIG. 1(*a*).

FIG. 2(*b*) is a view as seen in a direction of arrow 2B of FIG. 2(*a*).

FIG. 3(*b*) is a sectional view taken along line 3B of FIG. 2(*a*). FIG. 3(*c*) is a sectional view taken along line 3C of FIG. 2(*a*).

FIG. 4 (*a*) is a front view showing a back cover in a state where potting agent is not supplied thereto. FIG. 4(*b*) is a front view showing the back cover in a state of being fixed by the potting agent.

DESCRIPTION OF EMBODIMENTS

Figure 2A:
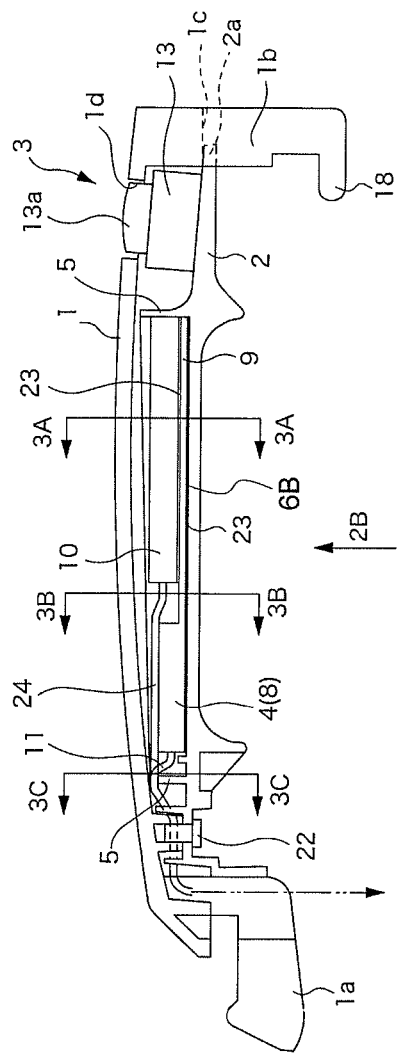
FIG. 2(*a*) is a longitudinal sectional view showing a handle main body.

An exemplary embodiment will be described with reference to the accompanying drawings. The exemplary embodiment is only an example of the invention and is not intended to limit the invention. All the features and combinations thereof described in the exemplary embodiment are not necessarily essential to the invention.

In the exemplary embodiment, as shown in FIG. 1(*b*), a vehicle door handle apparatus includes a handle base 17 fixed to a door panel (door 16) of the vehicle and a handle main body 3 connected to the handle base 17.

The door handle apparatus is configured as a so-called grip type handle apparatus which is operated by grasping the center of the handle main body 3 and rotating the handle main body around a rotation center (CH) for the handle base 17. The handle apparatus is mounted to the door of the vehicle in a posture where a rotation center end located at a left side in FIG. 1(*a*) and FIG. 1(*b*) is directed to a front end of the vehicle. As shown by the dashed line in FIG. 1(*b*), an actuating stepped part 18 is formed at a rotation end of the handle main body 3 by the rotational operation and moves an actuation piece 19*a* of a lever 19 in a surface direction of the door 16. The actuation piece 19*a* is moved in the surface direction of the door 16 and is rotatably connected to the handle base 17.

With the movement of the actuation piece 19*a*, the lever 19 is rotationally driven around a rotation center (CL) and thus a door lock device 21 mounted inside the door 16 is actuated via a transmission member 20 such as a cable connected to the lever 19. In this manner, lock of the door 16 is released.

Figure 2B:
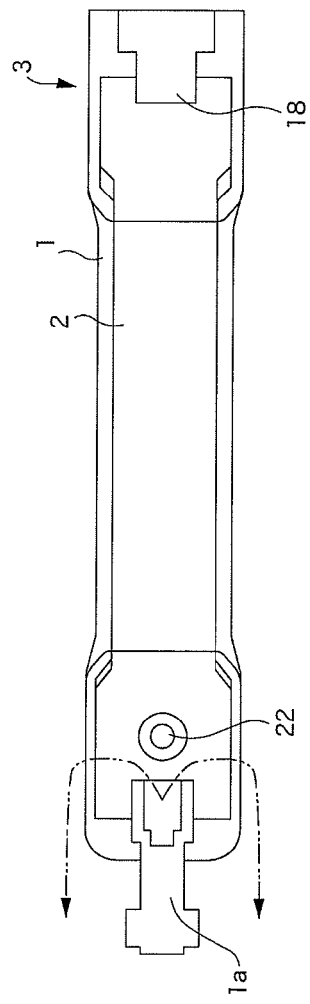
Figure 3A:
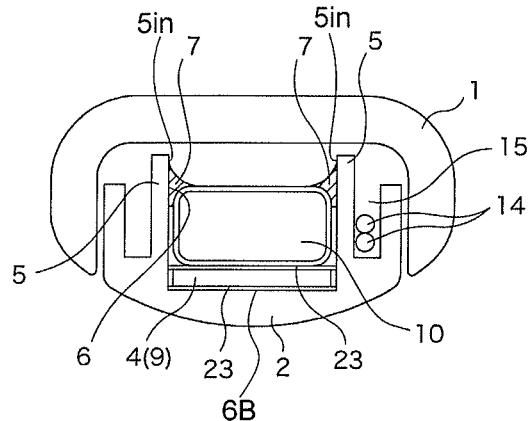
FIG. 3(*a*) is a sectional view taken along line 3A of FIG. 2(*a*).
Figure 3B:
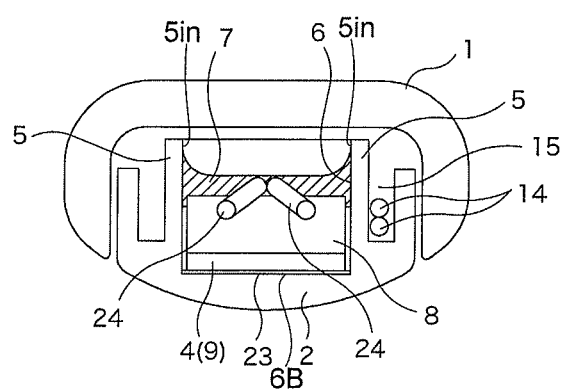

As shown in FIG. 2(*a*) and FIG. 3(*a*) to FIG. 3(*c*), the handle main body 3 is formed into a hollow shape by coupling a front cover 1 (a first cover 1) and a back cover 2 (a second cover 2) which are formed from synthetic resin material. A capacitance sensor 4 for detecting the contact of a user to the handle main body 3, an antenna 10 for communicating with a portable electronic key (not shown) possessed by the user and a push button switch 13 are accommodated in a hollow space in the handle main body 3.

As shown in FIG. 3(*a*) to FIG. 3(*c*), the front cover 1 constitutes an exposed surface when mounted to the door 16. The front cover has an opening which is open in a vehicle width center direction and is formed to have a substantially U-shaped section. As shown in FIG. 2(*b*), the front cover 1 is provided at its front end with a hinge protrusion 1*a* and provided at its rear end with an actuation leg 1*b* having the actuating stepped part 18.

The back cover 2 constitutes a rear surface wall facing the door panel 16 when mounted to the door and the back cover 2 is fitted and mounted to the opening of the front cover 1. Connection of the back cover 2 to the front cover 1 may be performed by inserting an attaching protrusion piece 2*a* formed at a rear end of the back cover into a mounting recess 1*c* formed at the front cover 1 and fixing a front end of the back cover by a screw 22.

The capacitance sensor 4 is configured as a unit which is obtained by covering a detection circuit and an electrode with synthetic resin material. The capacitance sensor 4 includes a thick block part 8 accommodating a mounting substrate on which the detection circuit is mounted and a laminar plate part 9 in which the electrode is accommodated. The detection circuit is connected to a lead wire 11 which is drawn from a front end surface of the block part 8, that is, a front end surface of the capacitance sensor 4. Contact to the handle main body 3 is detected by the output of the lead wire 11.

Further, the antenna 10 is formed by covering an antenna conductor with resin. In order to allow the antenna to be mounted onto the plate part 9, the antenna 10 has a rectangular parallelepiped shape in which the width dimension of the antenna 10 is substantially equal to the width dimension of the capacitance sensor 4 and the length dimension of the antenna 10 is slightly shorter than the length dimension of the plate part 9. Further, the height dimension of the antenna 10 is substantially equal to the height dimension of the block part 8 of the capacitance sensor 4. When the antenna 10 is placed on the plate part 9, an upper edge of the antenna 10 is located slightly above an upper edge of the block part 8.

In order to accommodate the capacitance sensor 4 and the antenna 10, the back cover 2 is formed with a rectangular accommodation recess 6 which is surrounded by partition walls 5. Accommodation of the capacitance sensor 4 or the like to the accommodation recess 6 is performed by placing the capacitance sensor 4 in the accommodation recess 6 and then placing the antenna 10 on the plate part 9. Adhesive tapes 23 are adhered to a bottom wall 6B of the accommodation recess 6 and an upper surface of the plate part 9 in order to prevent oscillation of the capacitance sensor 4 and the antenna 10.

The partition walls 5 of the accommodation recess 6 are placed close to the capacitance sensor 4 in order to prevent occurrence of unnecessary gap between a side wall surface of the capacitance sensor 4 and the partition walls. The height dimension of the partition walls 5 is set so that an upper edge of the partition walls 5 is located slightly above the upper edge of the antenna 10 in a state where the antenna 10 is stacked on the capacitance sensor 4.

Figure 3C:
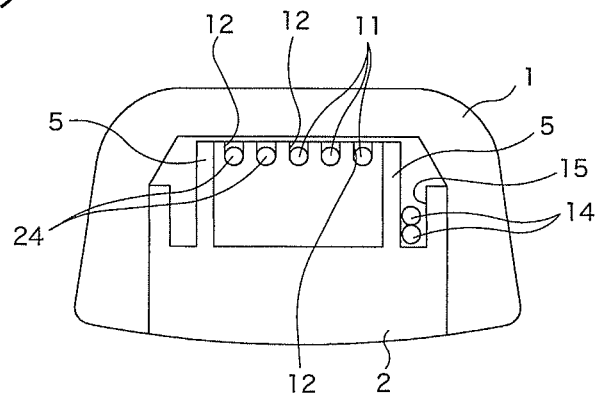

As shown in FIG. 3(c), the partition wall 5 of the accommodation recess 6 located at the front is formed with lead holders 12. Lead wires 11, 24 of the capacitance sensor 4 and the antenna 10 are fitted to the lead holders 12 and thus forming of the lead wire is implemented. Then, the lead wires are drawn out of the accommodation recess 6 and then are guided to a front end of the back cover 2.

In order to prevent a water or the like from entering the accommodation recess 6, potting agent 7 is supplied to an interface between the partition walls 5 of the accommodation recess 6 and the capacitance sensor 4 and an interface between the partition walls 5 and the antenna 10. Thereby, the potting agent 7 after curing is located at a gap between the capacitance sensor 4 and an inner wall surface 5in (which is also an inner wall surface 5in of the accommodation recess 6) of the partition walls which intersects a bottom surface of the bottom wall 6B of the accommodation recess 6. The partition walls 5 of the accommodation recess 6 are disposed close to a side wall of the capacitance wall 4 or the like and a gap between the partition walls 5 and the side wall of the capacitance wall 4 or the like is very narrow. Accordingly, when the supplied potting agent 7 before curing has a proper viscosity, the potting agent 7 does not entirely flow up to the bottom wall 6B of the accommodation recess 6 but some of the potting agent 7 remains at a supply position.

Consequently, the supplied potting agent 7 is deformed by its own weight depending on the viscosity while being cured. Then, the potting agent 7 is cured while forming a fillet shape, as shown in FIG. 3(a). Since the potting agent 7 cured into the fillet shape can effectively plug and seal the gap in a minimum amount, it is possible to reduce the potting agent 7 to be supplied and further to reduce waiting time until curing.

As shown hatched in FIG. 4(b), the potting agent 7 is supplied to an interface between the inner wall surface of the partition walls 5 and the capacitance sensor 4 or the antenna 10 corresponding to the inner wall surface and an interface between a front end surface of the antenna 10 and the plate part 9 of the capacitance sensor 4. After being cured, the potting agent is cured in a state where the potting agent is not supplied to some locations including a central part of the antenna 10.

Meanwhile, the push button switch 13 is fixed to a rear end of the back cover 2. The front cover 1 is provided with an operation opening 1d to allow an operation button 13a of the push button switch 13 to be exposed to the outside of the handle main body 3. As shown in FIGS. 3 and 4, lead wires 14 of the push button switch 13 are guided to the front through an insertion groove 15 which is formed between the partition walls 5 of the accommodation recess 6 and a side wall surface of the back cover 2. The insertion groove 15 is formed to pass through the back cover 2 in a longitudinal direction, so that two lead wires 14 drawn out of the push button switch 13 can pass through the insertion groove 15 in an overlapped state in a front-rear direction.

As the lead wires 14 of the push button switch 13 are inserted through the insertion groove 15, the lead wires 14 are prevented from being caught between the front cover 1 and the back cover 2 when the front cover 1 and the back cover 2 are connected to each other. Accordingly, it is possible to improve the assembling workability. In addition, as a suitable number of protrusions (not shown) which are pressed against the lead wires 14 are provided at the side wall of the insertion groove 15, it is possible to restrict the wiring orientation of the lead wires 14. Accordingly, it is possible to more securely prevent the lead wires 14 from being caught.

As shown in FIG. 4, the lead wires 14 of the push button switch 13 and the lead wires 11, 24 of the capacitance sensor 4 and the antenna 10 are integrated into a suitable number to form a lead wire group. Here, the lead wires 11, 24 are drawn out of the partition walls 5 of the accommodation recess 6. A connector 25 is mounted to one end of the lead wire group. As shown in FIG. 2, the lead wire group is drawn to the outside of the handle main body 3 from the front end of the handle main body 3.

As described above, according to the exemplary embodiment, the handle apparatus is configured by accommodating the capacitance sensor 4 into the hollow space in the handle main body 3 which is formed by stacking and coupling the front cover 1 (the first cover 1) and the back cover 2 (the second cover 2).

The capacitance sensor 4 is configured as a unit by covering the electrode and the detection circuit with an outer shell member made of synthetic resin. By this configuration, it is possible to omit an alignment operation between components of the capacitance sensor 4 when the capacitance sensor 4 is mounted to the handle main body 3.

Further, the capacitance sensor 4 is fixed to the accommodation recess 6 using the potting agent 7 to prevent a water from entering the bottom wall 6B of the accommodation recess 6.

Since the potting agent 7 is used not only as a sealing purpose but also as a fixation means to fix the capacitance sensor 4 to the accommodation recess 6, it is possible to securely prevent moisture from entering and residing in the periphery of the capacitance sensor 4, in particular, around the electrode, in addition to improvement in the assembling workability. Accordingly, the detection accuracy of the capacitance sensor 4 is also maintained.

In order to increase the detection accuracy when the capacitance sensor 4 is accommodated in the hollow space in the handle main body 3, it is desirable to place the electrode in close proximity to a contact surface. For this purpose, the electrode of the capacitance sensor 4 may be placed on the bottom wall 6B of the accommodation recess 6 which is closest to a surface layer of the handle main body 3 serving as a contact detecting surface.

Meanwhile, moisture present around the electrode affects the capacitance around the electrode and therefore causes the degradation of the detection accuracy. For this reason, it is desirable to restrict the access of a water or the like within a predetermined range by covering the periphery of the electrode with an insulation material such as synthetic resin, for example. However, when the electrode is covered with the insulation material, the electrode is spaced apart from a detection surface layer. Accordingly, it is difficult to form a sufficient thick coating in the periphery of the electrode, in particular, on a surface of the electrode facing the bottom wall of the accommodation recess 6.

To the contrary, since the potting agent 7 restricts penetration of a water or the like to the bottom wall of the accommodation recess 6, the coating to be formed at the periphery of the electrode, in particular, on a surface of the electrode facing the bottom wall of the accommodation recess 6 can be configured as a thin film enough to give rigidity required for effective assembling work or to prevent the corrosion of the electrode, for example. This contributes to the improvement of detection accuracy.

As long as the accommodation recess 6 can accommodate the capacitance sensor 4, the accommodation recess may have an appropriate shape and size. The potting agent 7 may be supplied in such a way that the inner wall surface 5in of the partition walls 5 is located close to an outer peripheral wall of the capacitance sensor 4 to minimize a gap between the outer periphery of the capacitance sensor 4 and the inner wall surface 5in of the partition walls 5 and a fillet shape is formed at the gap. By doing so, it is possible to reduce the amount of the potting agent 7 used for fixing and sealing the capacitance sensor.

Since the amount of the potting agent used is reduced and therefore the time required for curing the potting agent 7 is reduced, it is possible to improve the assembling efficiency.

Further, when the antenna 10 is accommodated in the handle main body 3, the capacitance sensor 4 may be fixed and sealed by the potting agent 7 in a state where the laminar plate part 9 accommodating the electrode is formed to protrude from the block part 8 accommodating the detection circuit, the antenna 10 is formed into a rectangular block shape by a resin-coated antenna conductor and the antenna 10 is stacked on the capacitance sensor 4. By doing so, the integration efficiency of the components can be improved.

Further, when an electronic component 13 (for example, a switch member) which is disposed outside of the accommodating recess 6 is attached to the handle main body 3, the insertion groove 15 may be formed to extend along the accommodation recess 6 between the accommodation recess 6 and an outer wall of the cover formed with the accommodation recess 6. By doing so, since the lead wires 14 of the electronic component 13 can be arranged while being fitted to the insertion groove 15, it is possible to improve the coupling workability of the front cover 1 and the back cover 2. In particular, in a case where the insertion groove 15 can exhibit a lead wire holding function by forming a narrow-width part in a part or the whole of the insertion groove 15, it is possible to prevent the lead wires 14 from being caught between the front cover 1 and the back cover 2 when the front cover 1 and the back cover 2 are coupled. Accordingly, it is possible to further improve the assembling workability.

According to the structure of the exemplary embodiment, since the assembling efficiency of the capacitance sensor is improved, the capacitance sensor is easy to assemble. Further, since penetration of water or the like to the periphery of the capacitance sensor is prevented, it is also possible to increase the detection accuracy of the capacitance sensor.

DESCRIPTION OF REFERENCE NUMERALS

1. Front Cover (First Cover)
2. Rear Cover (Second Cover)
3. Handle Main Body
4. Capacitance Sensor
5. Partition Wall
5in. Inner Wall Surface of Accommodation Recess
6. Accommodation Recess
6B. Bottom Wall of Accommodation Recess
7. Potting Agent
8. Block Part
9. Plate Part
10. Antenna
11. Lead Wire of Capacitance Sensor
12. Lead Wire Holder
13. Electronic Component
14. Lead Wire of Capacitance Sensor
15. Insertion Groove

The invention claimed is:

1. A vehicle door handle apparatus comprising:
a handle main body formed by coupling a first cover and a second cover; and
a capacitance sensor accommodated in a hollow space in the handle main body,
wherein the capacitance sensor is configured as a unit by covering a detection circuit and an electrode with an outer shell member made of synthetic resin,
wherein one of the first cover and the second cover includes partition walls and a bottom wall which are integrally formed with said one of the first cover and the second cover, the partition walls including an inner wall surface intersecting a bottom surface of the bottom wall, wherein an accommodation recess defined by the partition walls and the bottom wall is formed in said one of the first cover and the second cover, and
wherein the capacitance sensor is accommodated in the accommodation recess and fixed by a potting agent which prevents water from entering the bottom wall of the accommodation recess, the potting agent being positioned at a first gap between the inner wall surface and the capacitance sensor such that, after the potting agent has cured, a second gap between the bottom surface of the bottom wall and the potting agent in the first gap is formed.

2. The vehicle door handle apparatus according to claim 1, further comprising:
a handle base fixed to a door panel of a vehicle,
wherein the handle main body is connected to the handle base so as to be rotatable around a rotation center relative to the handle base.

3. The vehicle door handle apparatus according to claim 1, wherein the inner wall surface of the accommodation recess is placed close to an outer peripheral wall of the capacitance sensor, and
wherein the potting agent is supplied in a fillet form to the first gap between the outer peripheral wall of the capacitance sensor and the partition walls.

4. The vehicle door handle apparatus according to claim 1, wherein the capacitance sensor includes a block part accommodating the detection circuit and a plate part projecting from the block part and accommodating the electrode,
   wherein an antenna is formed into a rectangular block shape by a resin-coated antenna conductor and stacked on the plate part,
   wherein a side wall surface of the antenna is located close to the inner wall surface of the accommodation recess, and
   wherein the capacitance sensor and the antenna are fixed to the accommodation recess by the potting agent which is supplied in a fillet form to the first gap between the capacitance sensor and the inner wall surface of the accommodation recess, a third gap between the antenna and the inner wall surface of the accommodation recess and an interface between the plate part and the antenna.

5. The vehicle door handle apparatus according to claim 1, wherein a wall surface of the accommodation recess is formed with a lead wire holder to which a lead wire of the capacitance sensor is fitted and which restricts a drawing position of the lead wire out of the accommodation recess.

6. The vehicle door handle apparatus according to claim 1, wherein an insertion groove is formed between a longitudinal outer wall of the one cover formed with the accommodation recess and the partition wall of the accommodation recess, and a lead wire of an electronic component disposed outside of the accommodation recess and attached to the handle main body is inserted through the insertion groove.

7. A vehicle door handle apparatus comprising:
   a handle main body formed by coupling a first cover and a second cover; and
   a capacitance sensor accommodated in a hollow space in the handle main body,
   wherein the capacitance sensor is configured as a unit by covering a detection circuit and an electrode with an outer shell member made of synthetic resin,
   wherein one of the first cover and the second cover includes partition walls, side walls and a bottom wall which are integrally formed with said one of the first cover and the second cover, the partition walls including an inner wall surface intersecting a bottom surface of the bottom wall,
   wherein an accommodation recess defined by the partition walls and the bottom wall is formed in said one of the first cover and the second cover,
   wherein grooves are formed between the partition walls and the side walls, and
   wherein the capacitance sensor is accommodated in the accommodation recess and fixed by a potting agent which prevents water from entering the bottom wall of the accommodation recess.

8. The vehicle door handle apparatus according to claim 7, wherein the potting agent is positioned at a first gap between the inner wall surface and the capacitance sensor such that, after the potting agent has cured, a second gap between the bottom surface of the bottom wall and the potting agent in the first gap is formed.

* * * * *